(12) United States Patent
See et al.

(10) Patent No.: US 6,518,133 B1
(45) Date of Patent: Feb. 11, 2003

(54) METHOD FOR FABRICATING A SMALL DIMENSIONAL GATE WITH ELEVATED SOURCE/DRAIN STRUCTURES

(75) Inventors: Alex See, Singapore (SG); Yeow Kheng Lim, Singapore (SG); Cher Liang Randall Cha, Singapore (SG)

(73) Assignee: Chartered Semiconductor Manufacturing LTD, Singapore (SG)

( * ) Notice: Subject to any disclaimer, the term of this patent is extended or adjusted under 35 U.S.C. 154(b) by 0 days.

(21) Appl. No.: 10/128,967

(22) Filed: Apr. 24, 2002

(51) Int. Cl.[7] .............................................. H01L 21/336
(52) U.S. Cl. ........................ 438/300; 438/301; 438/303
(58) Field of Search ................................ 438/299–307; 257/900, 401, 344, 336, 408

(56) References Cited

U.S. PATENT DOCUMENTS

| | | | |
|---|---|---|---|
| 5,786,255 A | 7/1998 | Yeh et al. ..................... | 438/299 |
| 6,090,672 A | 7/2000 | Wanlass ....................... | 438/301 |
| 6,090,691 A | 7/2000 | Ang et al. .................... | 438/564 |
| 6,124,177 A | 9/2000 | Lin et al. ..................... | 438/305 |
| 6,159,782 A | 12/2000 | Xiang et al. ................. | 438/197 |
| 6,271,132 B1 | 7/2001 | Xiang et al. ................. | 438/682 |

*Primary Examiner*—Carl Whitehead, Jr.
*Assistant Examiner*—Thanh Nguyen

(57) ABSTRACT

A method of manufacturing a transistor with a small self aligned gate and self aligned elevated source/drain regions. A first insulating layer is formed over a substrate. A first opening is formed in the first insulating layer to expose the substrate. We form a gate dielectric layer over the substrate in the first opening. Next, first spacers are formed on the sidewalls of the first insulating layer. A gate layer is formed over the first insulating layer, the first spacers, and the gate dielectric layer. We planarize the gate layer to form a gate electrode. The first spacers are removed to form LDD openings. Next, we form lightly doped source/drain regions in the substrate in the LDD openings. Subsequently, second spacers are formed on the sidewalls of the first insulating layer and on the sidewalls of the gate electrode to form S/D openings. Source/drain regions are formed in the substrate in the S/D openings. Next, we form a conductive layer over the substrate at least partially filling the S/D openings. The conductive layer is planarized to form elevated source/drain structures.

21 Claims, 5 Drawing Sheets

METHOD FOR FABRICATING A SMALL DIMENSIONAL GATE WITH ELEVATED SOURCE/DRAIN STRUCTURES

BACKGROUND OF THE INVENTION

1) Field of the Invention

This invention relates generally to in semiconductor devices and more particularly to field effect transistors (FETs), such as MOSEFETs and the fabrication FETs with gates and source/drain regions and more particularly to the fabrication of a small dimension gate and elevated source/drain structures using self-aligned and planarization processes.

2) Description of the Prior Art

MOS gate technology defines an MOS transistor location by a field oxide (isolation) opening, and defines the MOS channel region location by a polysilicon gate electrode overlying this opening. The width of the polysilicon (poly) determines the channel length L, and the width of the field oxide (isolation) opening determines the channel width W. The poly is made longer than the channel width to allow for misalignment tolerance. For a very narrow sub micron channel width this tolerance can be almost as large as the width. Furthermore, if a metal connection is to be made to the poly, the poly has to extend even further beyond the channel width to make room for a contact hole to the metal, severely limiting layout density.

A second shortcoming with gate technology arises from the fact that the polysilicon is used for a first layer interconnect as well as defining the MOS gate electrodes. This means that polysilicon cannot be patterned to freely cross over a diffusion without also creating an MOS transistor at the cross over location.

Another problem with gate technology is that the channel length L is determined by the poly width, which width is determined by the width of radiation patterned photoresist. To produce ever faster circuits, it is desirable to make L as short as possible.

The importance of overcoming the various deficiencies noted above is evidenced by the extensive technological development directed to the subject, as documented by the relevant patent and technical literature. Relevant technical developments in the patent literature can be gleaned by considering: U.S. Pat. No. 6,271,132 B1(Xiang et al.) that discloses a self-aligned S/D with damascene gate process. U.S. Pat. No. 6,090,691(Ang et al.) shows a Tx process. U.S. Pat. No. 6,090,672(Wanlass) shows a damascene transistor process. U.S. Pat. No. 6,124,177(Lin et al.) reveals an inverse gate process with air spacers. U.S. Pat. No. 5,786,255(Yeh et al.) shows a transistor process including a CMP step. U.S. Pat. No. 6,159,782(Xiang et al.) shows another inverse gate process.

However, these further improvements are needed to produce smaller gates and elevated source/drain structures with more manufacturable processes.

SUMMARY OF THE INVENTION

It is an object of an embodiment of the present invention to provide a method for fabricating a transistor having a small dimension gate and raised source and drains structures.

It is an object of an embodiment of the present invention to provide a method for fabricating a transistor having a small dimension silicide gate and raised source and drains structures.

It is an object of an embodiment of the present invention to provide a method for fabricating a transistor having a small dimension polysilicon/silicide gate and self aligned raised metal source and drains structures using two planarization steps.

The present invention provides a method of manufacturing a transistor with a self aligned gate and self aligned elevated source/drain structures. A first insulating layer is formed over a substrate. A first opening is formed in the first insulating layer to expose the substrate. We form a gate dielectric layer over the substrate in the first opening. Next, first spacers are formed on the sidewalls of the first insulating layer. A gate layer is formed over at least the gate dielectric layer. We planarize the gate layer to form a gate electrode. The first spacers are removed to form LDD openings. Next, we form lightly doped source/drain regions in the substrate in the LDD openings. Subsequently, second spacers are formed on the sidewalls of the first insulating layer and on the sidewalls of the gate electrode to form S/D openings. Source/drain regions are formed in the substrate in the S/D openings. Next, we form a conductive layer over the substrate at least partially filling the S/D openings. The conductive layer is planarized to form elevated source/drain structures.

In another aspect of the invention, the gate electrode is comprised of polysilicon and a silicide such as tungsten silicide.

In another aspect of the invention, the elevated source/drain regions are comprised of metal, such as a three layer Ti/TiN/W structure.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. A preferred embodiment of the present invention provides a method of forming a gate and elevated source/drain structures.

Figure 1:
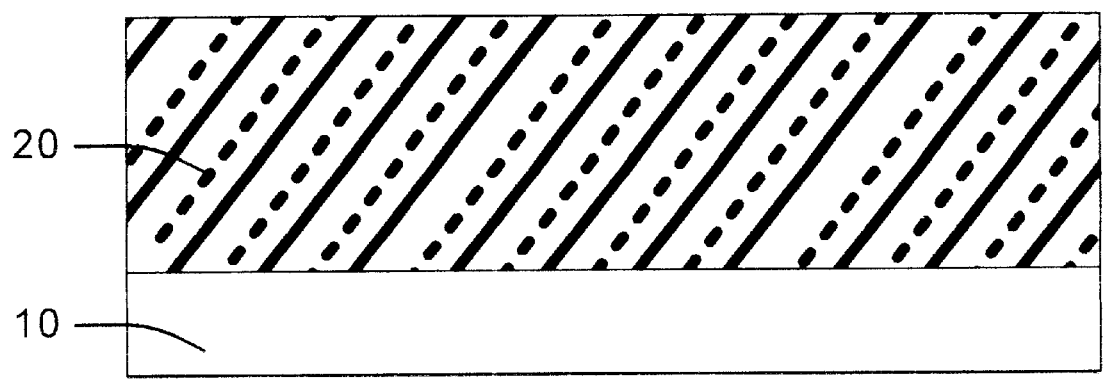
FIGS. 1 through 10 are cross sectional views for illustrating an embodiment of the invention for fabricating a transistor with a gate and raised source and drain structures.

Referring to FIG. 1, a first insulating layer 20 is formed over a substrate 10. The substrate can be any suitable structure. The substrate can be a single crystal silicon having a <100> crystallographic orientation and can be doped with a P type dopant such as boron. The embodiment is not limited to any type substrate, and can be other substrates such as SOI, etc.

The first insulating layer 20 is preferably comprised of a dielectric and most preferably comprised of silicon oxide. The first insulating layer 20 preferably has a thickness between 1500 and 2500 Å.

Figure 2:
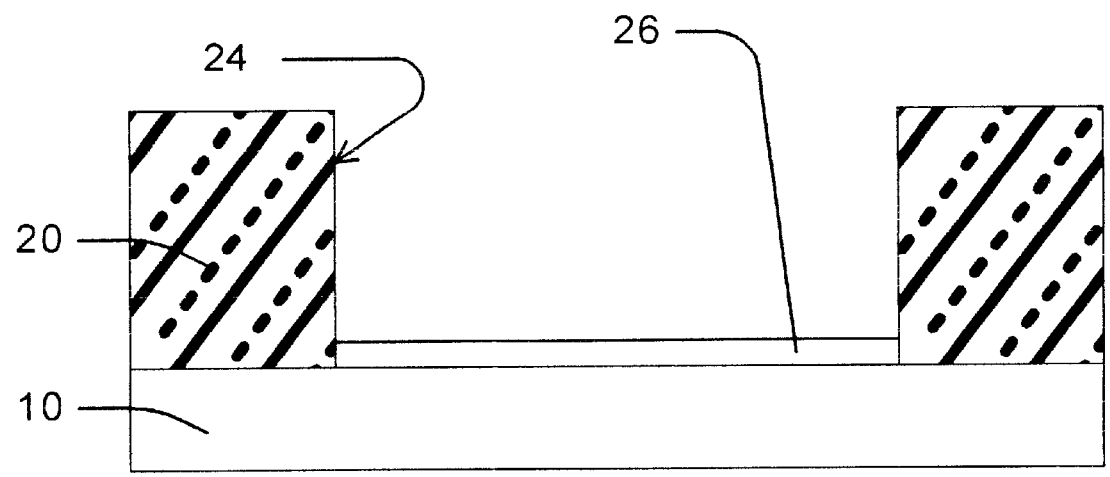

Referring to FIG. 2, we form a first opening 24 in the first insulating layer to expose the substrate. The first opening is defined by sidewalls of the first insulating layer 20 in the first opening. The first opening preferably has a dimension between 1 and 2 $\mu$m.

Figure 3:
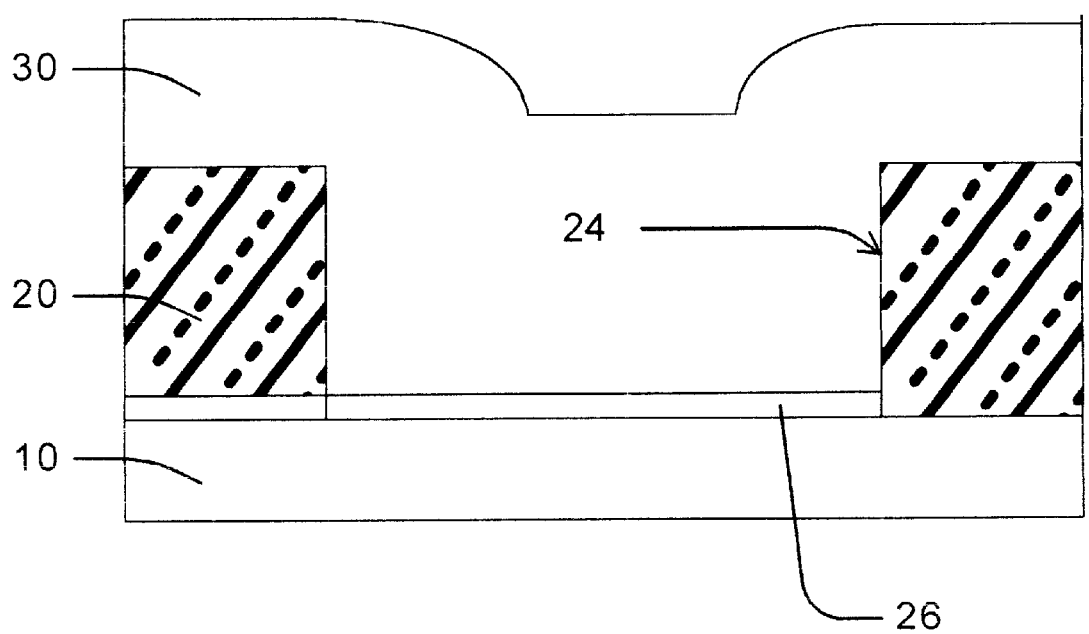

As shown in FIG. 3, we form a gate dielectric layer 26 over the substrate 10 in the first opening 24. The gate dielectric layer can be deposited or grown using a thermal oxidation. The gate dielectric layer 26 preferably has a thickness between 10 and 50 Å. The gate dielectric layer can be comprised of silicon oxide, high k materials, nitrided oxide, $HfO_2$, $ZrO_2$ and $Al_2O_3$ and most preferably comprised of silicon oxide.

As shown.in FIG. .3, we form a first dielectric layer 30 over the substrate and in the first opening 24.

The first dielectric layer can be comprised of material with that can be etched selectively to the.first insulating layer 20 and the subsequently formed gate electrode 40A. The first dielectric layer can be comprised of silicon nitride, or Silicon oxynitride (SiON) and is preferably comprised of silicon nitride. The first dielectric layer 30 preferably has a thickness between 3000 and 5000 Å.

Figure 4:
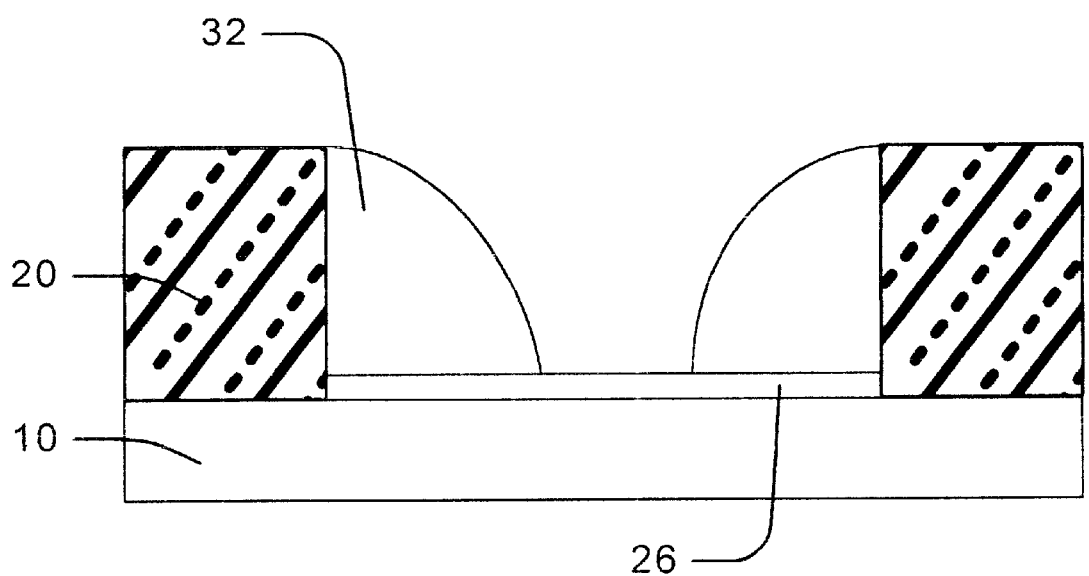

As shown in FIG. 4, we anisotropically etch the first dielectric layer 30 to form first spacers 32 on the sidewalls.of the first insulating layer 20. An important feature of the invention is that the width of the first spacers can be controlled by the dep and etch processes to control the dimensions of the gate electrode and subsequently formed LDD and S/D regions.

Figure 5:
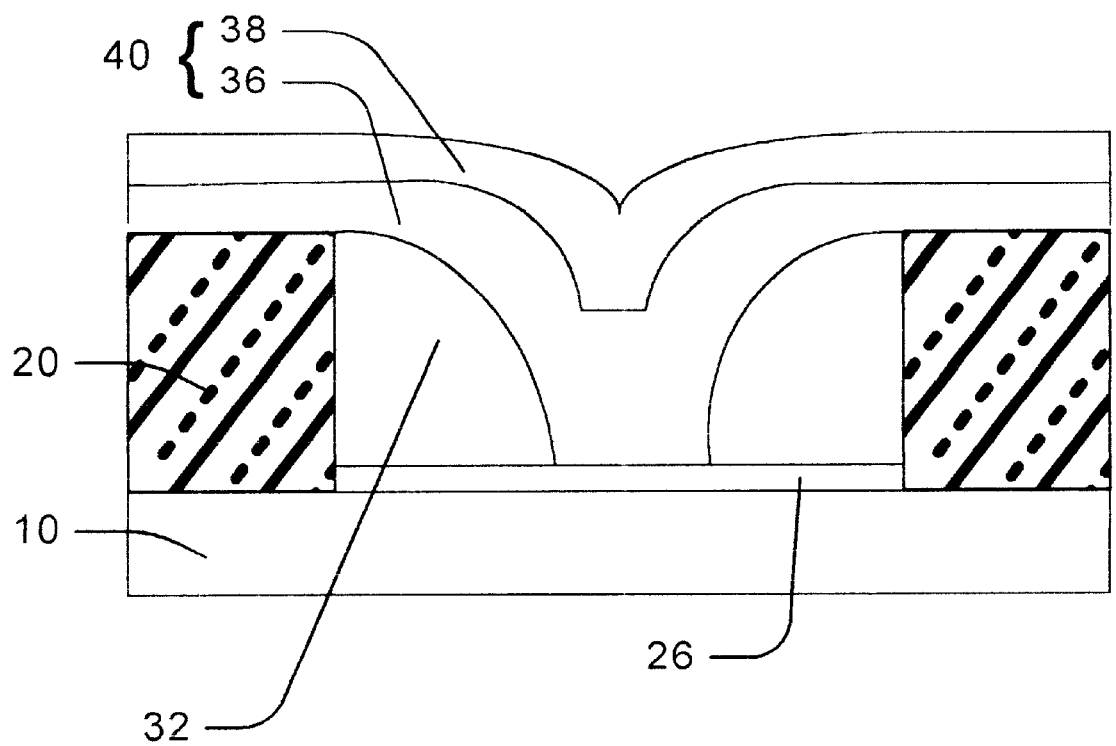

Referring to FIG. 5, we form a gate layer 40 over the first insulating layer 20, the first spacers 32, and the gate dielectric layer 26. The gate layer can be comprised of: polysilicon, doped polysilicon, or a two layer Poly/silicide. The gate layer can be comprised of one layer or more that one layer.

The gate layer 40 is preferably comprised of a first polysilicon layer 36 and a first silicide layer 38. The first polysilicon layer 36 comprised of doped polysilicon preferably a thickness between 1000 and 1500 Å. The doped polysilicon layer preferably has a doping concentration between 1E20 and 1E21 atoms/cm$^3$.

The first silicide layer 38 is preferably comprised of tungsten silicide and preferably has a thickness between 2000 and 5000 Å. The first silicide layer (e.g., $WSi_x$) 38 reduces the contact resistance and local interconnect resistance. The shape of the silicide gate is an advantage.

Figure 6:
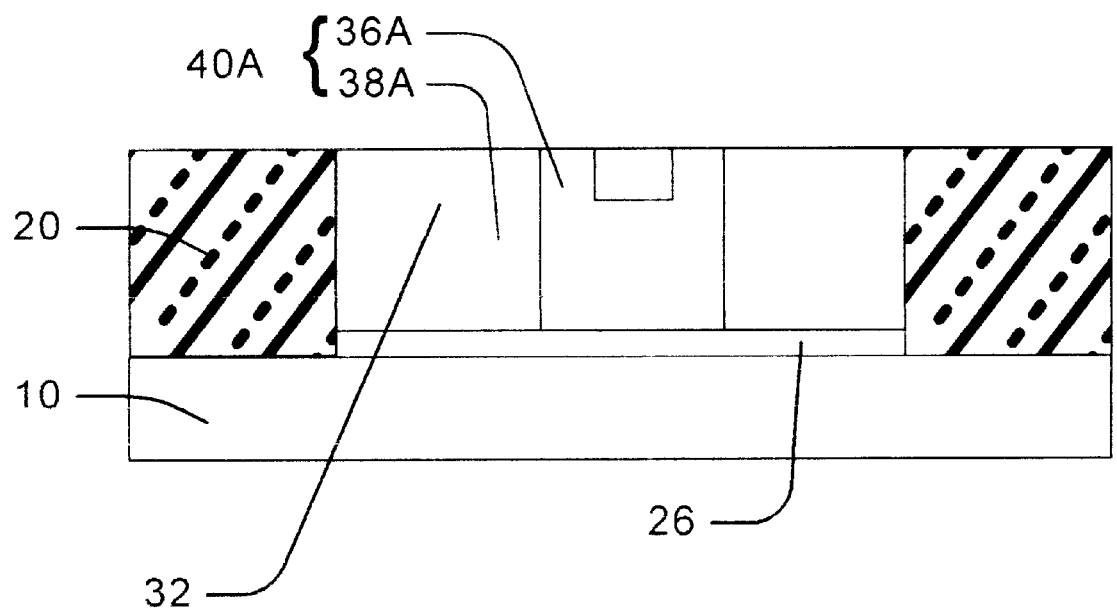

As shown in FIG. 6, we planarize the first insulating layer 20, first spacers 32 and gate layer 40 to form a gate electrode 40A. The planarizing of the gate layer 40 preferably comprises a chemical-mechanical polish (CMP) step.

Figure 7:
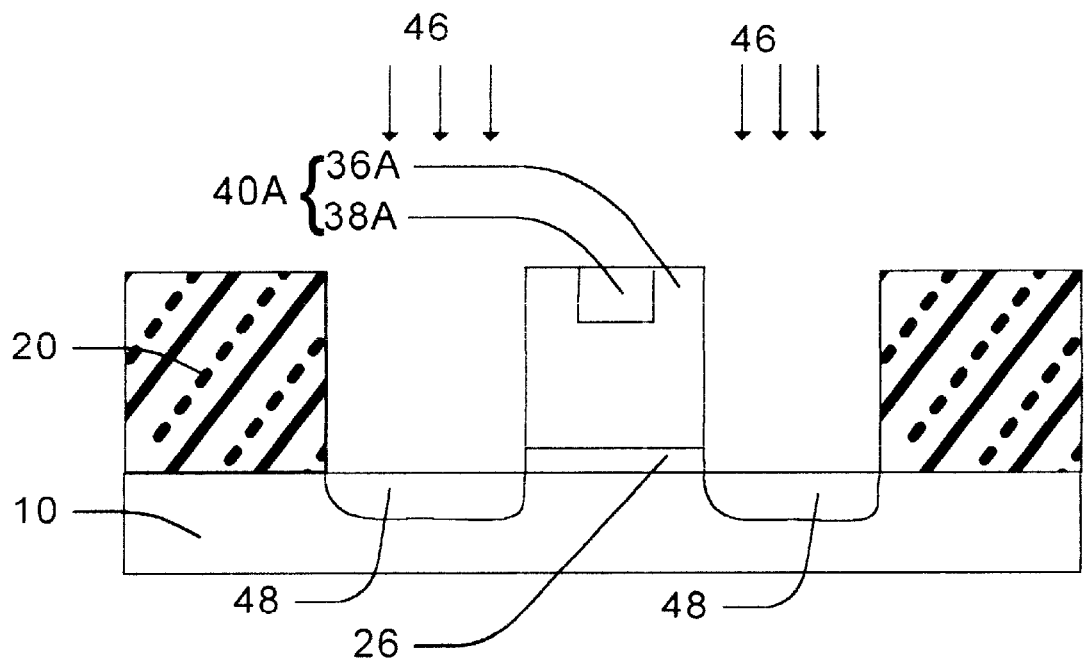

Referring to FIG. 7, we remove the first spacers 32 and the underlying gate dielectric 26 to form LDD openings 44. The removal of the first spacers is preferably performed using an etch selective to the first spacers and the gate electrode 40A/insulating layer 20. The etch is preferably hot phosphoric acid etch. A buffered HF etch can be used to remove the gate dielectric comprised of oxide.

As shown in FIG. 7, lightly doped source/drain regions 48 are formed in the substrate 10 in the LDD openings 44 adjacent to the gate electrode. The lightly doped source/drain regions 48 are preferably formed using an ion implant process where ions 46 are implanted through the openings 44.

Figure 8:
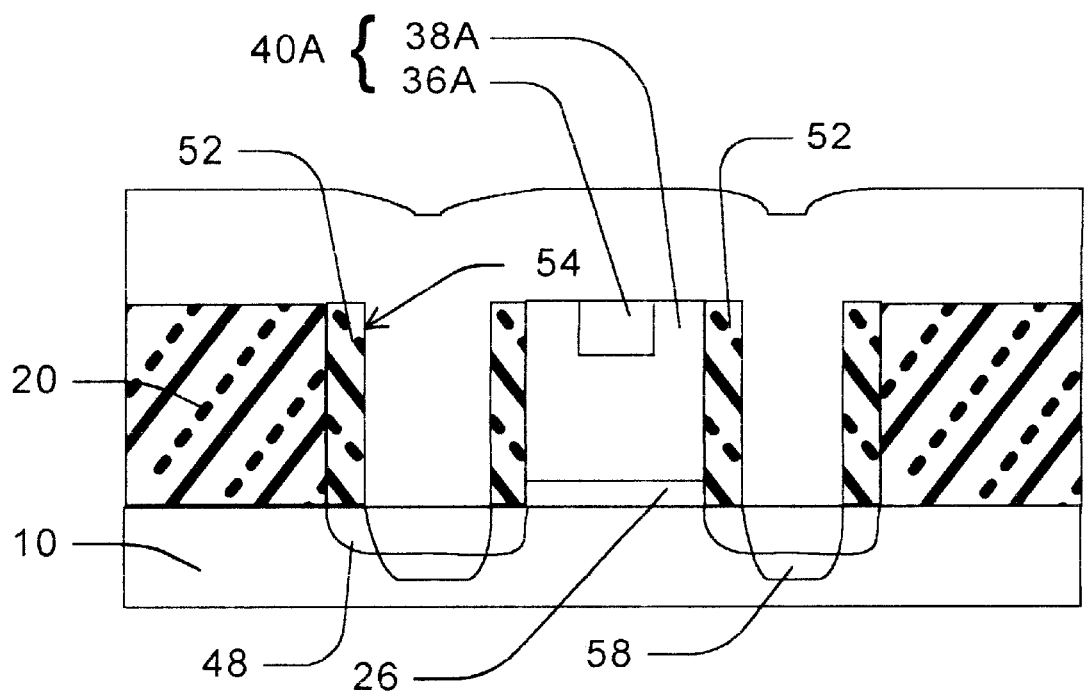

As shown in FIG. 8, second spacers 52 are formed on the sidewalls of the first insulating layer 20 and on the sidewalls of the gate electrode 40A to form a S/D openings 54. The second spacers can be formed depositing a blanket layer over the substrate and anisotropically etching the layer. The second spacers can be formed of a dielectric material such as, silicon oxide, silicon nitride or Silicon oxynitride.

As shown in FIG. 8, we form source/drain regions 58 in the substrate in the S/D openings 54. The source and drain regions are preferably formed by an ion implant process by implanting ion through the S/D openings 54. An important feature is that the spacers width can be controlled, by the deposition and etch steps, to control the size of the S/D regions 58 and the subsequently formed elevated S/D structures (See FIG. 10, 60A). This is a benefit of the invention.

Figure 9:
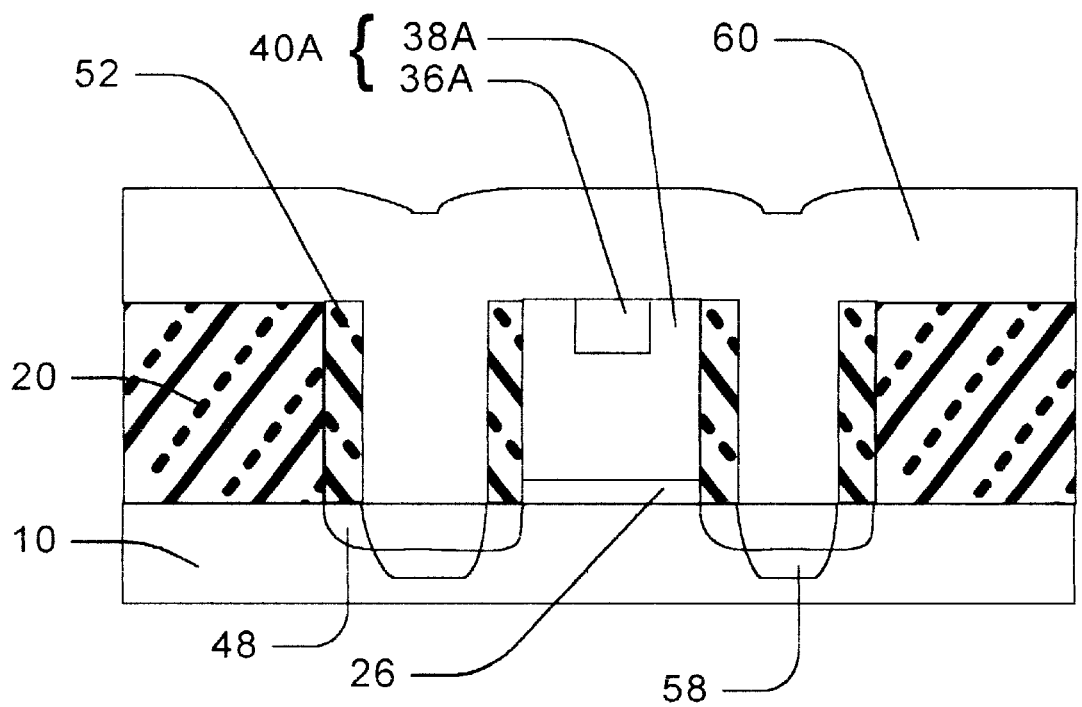

As shown in FIG. 9, we form a conductive layer 60 over the substrate at least filling the S/D openings 54. The conductive layer 60 can be comprised of a metal layer, metal layers or a three layer structure of Ti/TiN/W. More preferably the conductive layer is comprised of three layer structure of Ti/TiN/W. The three layer structure of Ti/TiN/W preferably has a top W layer, a middle TiN layer and a bottom Ti layer.

The conductive layer is preferably a metal, such as a three layer structure of Ti/TiN/W and preferably has a overall thickness between 2000 and 4000 Å. The triple layer structure is deposited consisting of a first thin layer of titanium (Ti) about 100 Å thick, followed by a thin layer of TiN about 100 Å thick, finished with a layer of tungsten (W) thicker than the depth of the openings 54. The Ti assures an ohmic contact to the S/D regions 58. The TiN acts as a barrier layer between the W and the Ti.

Figure 10:
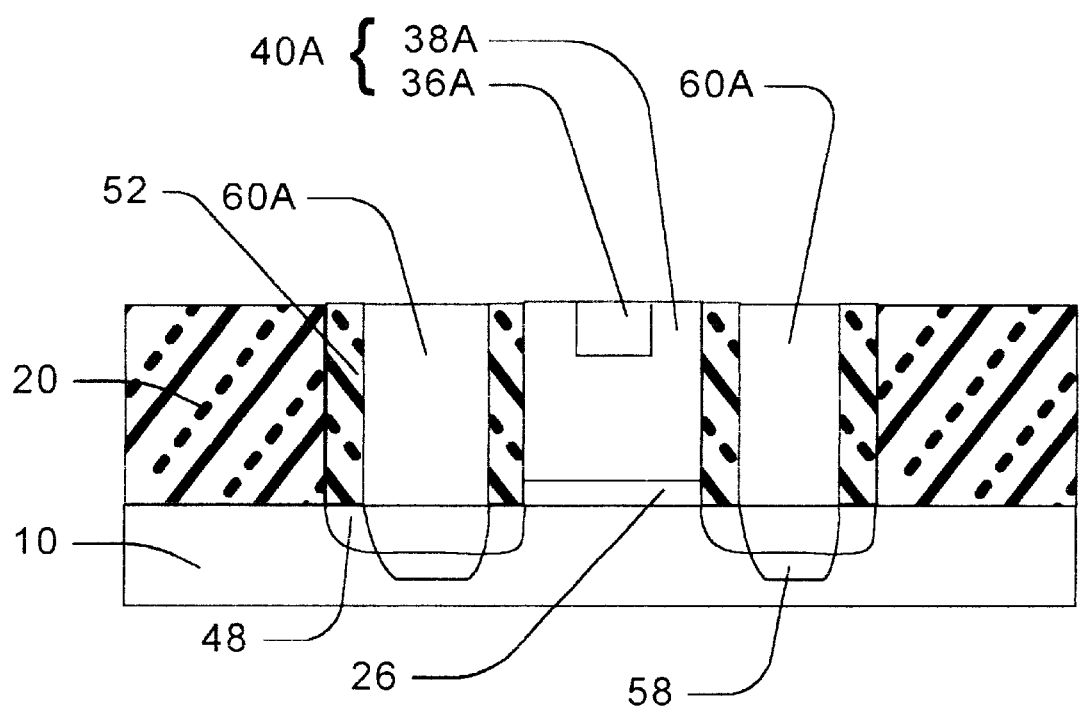

Referring to FIG. 10, the conductive layer 60 is planarized to form elevated source/drain structures 60A (e.g., contacts or terminals). Preferably the conductive layer is planarized using a chemical-mechanical polish (CMP) process. Preferably the conductive layer is planarized to a level about even with the top surface of the first insulating layer 20.

Conventional processing to be used to complete the semiconductor device. For example, an interlevel dielectric (ILD) layer can be formed followed by contact definition.

Benefits Of The Invention

The embodiments of the invention provide many advantages over the prior art. The invention provides a manufacturable process to form small dimension gates without using lithography and elevated source drain structures.

The embodiments of the invention's first and second spacers allow the dimensions of the gate, LDD, S/D and elevated S/D structures to be controlled.

Embodiments of the invention provide for the gate length to be defined by film thickness (e.g., film 30) rather than by lithography.

The embodiments of the invention's self aligned the gate, LDD, S/D and elevated S/D to reduce alignment error and provide a more manufacturable process.

Yet another advantage is that the elevated S/D structures can be comprised of metals and can be realized with conventional PVD (e.g., for Ti/TiN dep) and CVD (e.g., for W deposition) processes.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

The invention can be used to form both N-MOS and/or P-MOS devices.

In the above description numerous specific details are set forth such as sizes, thicknesses, and doses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Unless explicitly stated otherwise, each numerical value and range should be interpreted as being approximate as if the word "about" or "approximately" preceded the value or the range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a gate and elevated source/drain structures comprising:
   a) forming a first insulating layer over a substrate;
   b) forming a first opening in said first insulating layer to expose said substrate; said first opening defined by sidewalls of said first insulating layer;
   c) forming a gate dielectric layer over said substrate in said first opening;
   d) forming first spacers on said sidewalls of said first insulating layer;
   e) forming a gate layer over said first insulating layer, said first spacers, and said gate dielectric layer;
   f) planarizing said gate layer to form a gate electrode; said gate electrode has sidewalls;
   g) removing said first spacers to form LDD openings;
   h) forming lightly doped source/drain regions in said substrate in said LDD openings;
   i) forming second spacers on said sidewalls of said first insulating layer and on the sidewalls.of said gate electrode to form a S/D openings;
   j) forming source/drain regions in said substrate in said S/D openings;
   k) forming a conductive layer over said substrate at least partially filling said S/D openings; and
   l) planarizing said conductive layer to form elevated source/drain structures.

2. The method of claim 1 wherein said first insulating layer is comprised of silicon oxide.

3. The method of claim 1 wherein said first insulating layer has a thickness between 1500 and 2500 Å.

4. The method of claim 1 wherein said gate dielectric layer has a thickness between 10 and 50 Å and said gate dielectric layer is comprised of a material selected from the group consisting of silicon oxide, nitrided oxide High-k dieletrics, HfO2, $ZrO_2$ and $Al_2O_2$.

5. The method of claim 1 wherein said first dielectric layer has a thickness between 3000 and 5000 Å.

6. The method of claim 1 wherein said first dielectric layer is comprised of silicon nitride or silicon oxynitride.

7. The method of claim 1 wherein the step of forming said first spacers comprises:
   forming a first dielectric layer over said substrate and in said first opening; said first dielectric layer having a different etch selectivity than said first insulating layer;
   anisotropically etching said first dielectric layer to form first spacers on the sidewalls of said first insulating layer.

8. The method of claim 1 wherein said gate layer is comprised of a first polysilicon layer and a first silicide layer.

9. The method of claim 1 wherein said gate layer is comprised of a first polysilicon layer and a first silicide layer; said first polysilicon layer is comprised of doped polysilicon and has a thickness between about 1000 and 1500 Å; said first silicide layer is comprised of tungsten silicide; and has a thickness between about 2000 and 5000 Å.

10. The method of claim 1 wherein the planarizing of said gate layer comprised a chemical-mechanical polish process.

11. The method of claim 1 wherein the removal of said first spacers is performed using an etch selective to said first spacers.

12. The method of claim 1 wherein the removal of said first spacers is performed using a phosphoric acid etch.

13. The method of claim 1 wherein said lightly doped source/drain regions are formed using an ion implant process.

14. The method of claim 1 wherein said conductive layer is comprised of a three layer structure of Ti/TiN/W, and has a thickness between 2000 and 4000 Å.

15. A method of fabrication of a gate and elevated source/drain regions comprising:
   a) forming a first insulating layer over a substrate;
   b) forming a first opening in said first insulating layer to expose said substrate; said first opening defined by sidewalls of said first insulating layer;
   c) forming a gate dielectric layer over said substrate in said first opening;
   d) forming a first dielectric layer over said substrate and in said first opening; said first dielectric layer having a different etch selectivity than said first insulating layer;
   e) anisotropically etching said first dielectric layer to form first spacers on the sidewalls of said first insulating layer;
   f) forming a gate layer over said first insulating layer, said first spacers, and said gate dielectric layer;
      (1) said gate layer is comprised of a first polysilicon layer and a first silicide layer;
   g) planarizing said gate layer using chemical-mechanical polishing to form a gate electrode; said gate electrode has sidewalls;
   h) removing said first spacers to form LDD openings; the removal of said first spacers is performed using an etch;
   i) forming lightly doped source/drain regions in said substrate in said LDD openings; said lightly doped source/drain regions are formed using an ion implant process;
   j) forming second spacers on said sidewalls of said first insulating layer and on the sidewalls of said gate electrode to form a S/D openings;
   k) forming source/drain regions in said substrate in said S/D openings;

l) forming a conductive layer over said substrate at least filling said S/D openings; said conductive layer is comprised of a three layer structure of Ti/TiN/W; and m) planarizing said conductive layer using chemical-mechanical polishing to form elevated source/drain regions.

16. The method of claim 15 wherein said first insulating layer is comprised of silicon oxide; said first insulating layer has a thickness between 1500 and 2500 Å.

17. The method of claim 15 wherein said gate dielectric layer has a thickness between 10 and 50 Å and said gate dielectric layer is comprised of silicon oxide, nitrided oxide, high k dielectrics, $HfO_2$, $ZrO_2$ and $AlO_3$.

18. The method of claim 15 wherein said first dielectric layer has a thickness between 3000 and 5000 Å.

19. The method of claim 15 wherein said first dielectric layer is comprised of silicon nitride.

20. The method of claim 15 wherein said first polysilicon layer 36 comprised of doped polysilicon and has a thickness between 1000 and 1500 Å; said first silicide layer is comprised of tungsten silicide; and had a thickness between 2000 and 5000 Å.

21. The method of claim 15 wherein said conductive layer has a thickness between 2000 and 4000 Å.

* * * * *